(12) United States Patent
Ito

(10) Patent No.: US 12,151,289 B2
(45) Date of Patent: Nov. 26, 2024

(54) COATED TOOL AND CUTTING TOOL INCLUDING SAME

(71) Applicant: KYOCERA Corporation, Kyoto (JP)

(72) Inventor: Hirotoshi Ito, Satsumasendai (JP)

(73) Assignee: KYOCERA CORPORATION, Kyoto (JP)

(*) Notice: Subject to any disclaimer, the term of this patent is extended or adjusted under 35 U.S.C. 154(b) by 770 days.

(21) Appl. No.: 17/298,025

(22) PCT Filed: Nov. 27, 2019

(86) PCT No.: PCT/JP2019/046374
§ 371 (c)(1),
(2) Date: May 28, 2021

(87) PCT Pub. No.: WO2020/111122
PCT Pub. Date: Jun. 4, 2020

(65) Prior Publication Data
US 2022/0088686 A1 Mar. 24, 2022

(30) Foreign Application Priority Data
Nov. 29, 2018 (JP) .................. 2018-223527

(51) Int. Cl.
*B23B 27/14* (2006.01)
*C23C 28/04* (2006.01)
(52) U.S. Cl.
CPC .......... *B23B 27/148* (2013.01); *C23C 28/042* (2013.01); *C23C 28/044* (2013.01);
(Continued)

(58) Field of Classification Search
None
See application file for complete search history.

(56) References Cited

U.S. PATENT DOCUMENTS

2007/0292670 A1 12/2007 Okada et al.
2011/0219971 A1 9/2011 Brudermann et al.
(Continued)

FOREIGN PATENT DOCUMENTS

CN 102596456 A 7/2012
JP 2006272515 * 10/2006
(Continued)

OTHER PUBLICATIONS

Machine Translation of JP2006272515 (Year: 2006).*
(Continued)

*Primary Examiner* — Shawn Mckinnon
(74) *Attorney, Agent, or Firm* — HAUPTMAN HAM, LLP

(57) ABSTRACT

A coated tool includes a base and a coating layer located on the base. The coating layer includes a first layer having a thickness of 1 μm or more located near the base, and a second layer located more away from the base than the first layer. An erosion rate A2 in the second layer is 0.4 μm/g or less which is obtained from a measurement by collision of a liquid A, in which 3 mass % of spherical $Al_2O_3$ particles having a mean particle diameter of 1.1-1.3 μm is dispersed in pure water, against the second layer. An erosion rate A1 in the first layer is 1.8 μm/g or less which is obtained from a measurement by collision of the liquid A against the first layer. A cutting tool includes a holder which includes a pocket, and the coated tool located in the pocket.

6 Claims, 3 Drawing Sheets

(52) U.S. Cl.
CPC ....... *B23B 2224/28* (2013.01); *B23B 2224/32* (2013.01); *B23B 2224/36* (2013.01)

(56) References Cited

U.S. PATENT DOCUMENTS

| | | |
|---|---|---|
| 2012/0269589 A1 | 10/2012 | Igarashi et al. |
| 2016/0175940 A1 | 6/2016 | Lindahl et al. |

FOREIGN PATENT DOCUMENTS

| | | |
|---|---|---|
| JP | 2006272515 A | 10/2006 |
| JP | 2016137564 A | 8/2016 |
| KR | 10-2007-0041791 A | 4/2007 |
| KR | 10-1528790 B1 | 6/2015 |
| WO | 2017163972 A1 | 9/2017 |

OTHER PUBLICATIONS

Yoshiyasu Nanjo et al, "Study on Evaluation of the Mechanical Property in TiCN Single-layer and Multi-layer Coatings by a Micro Slurry-jet Erosion (MSE) Method", Journal of the Japan Society for Precision Engineering, Feb. 5, 2018, pp. 167-174, vol. 84, No. 2, Japan, 8pp.

* cited by examiner

COATED TOOL AND CUTTING TOOL INCLUDING SAME

RELATED APPLICATIONS

The present application is a National Phase of International Application No. PCT/JP2019/046374, filed Nov. 27, 2019, and claims priority based on Japanese Patent Application No. 2018-223527, filed Nov. 29, 2018.

TECHNICAL FIELD

The present disclosure relates to a coated tool including a coating layer on a surface of a base, and a cutting tool including the coated tool.

BACKGROUND

Coated tools, such as cutting tools with a coating layer, have been known in which a TiCN layer and an $Al_2O_3$ layer are laminated one upon another on a surface of a base composed of cemented carbide, cermet, ceramics, or the like.

High wear resistance has been desired for the coating film in the coated tool. The $Al_2O_3$ layer generally has higher wear resistance than the TiCN layer. Therefore, a coated tool including the $Al_2O_3$ layer is discussed in, for example, Patent Document 1, and it is intended to improve wear resistance of a coated cutting tool by controlling orientation of $Al_2O_3$ crystals included in the $Al_2O_3$ layer.

RELATED ART DOCUMENTS

Patent Document

Patent Document 1: Japanese Unexamined Patent Publication No. 2016-137564

SUMMARY

A coated tool in the present disclosure includes a base and a coating layer located on the base. The coating layer includes a first layer and a second layer. The first layer has a thickness of 1 μm or more and is located near the base. The second layer is located more away from the base than the first layer. An erosion rate A2 in the second layer is 0.4 μm/g or less which is obtained from a measurement by collision of a liquid A, in which 3 mass % of spherical $Al_2O_3$ particles having a mean particle diameter of 1.1-1.3 μm is dispersed in pure water, against the second layer. An erosion rate A1 in the first layer is 1.8 μm/g or less which is obtained from a measurement by collision of the liquid A against the first layer. A cutting tool in the present disclosure includes a holder which is extended from a first end toward a second end and includes a pocket on a side of the first end, and the coated tool located in the pocket.

EMBODIMENT

<Coated Tools>

Figure 1:
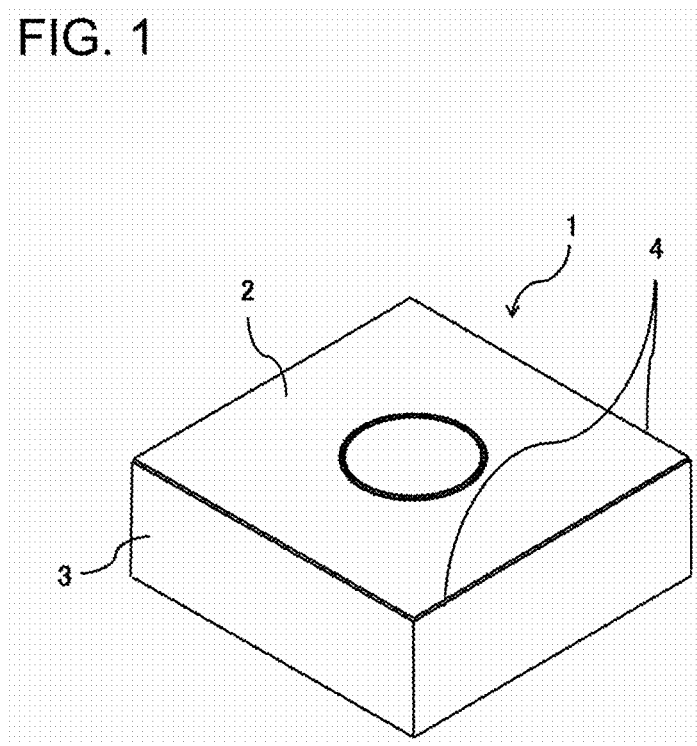
FIG. 1 is a schematic perspective view illustrating an embodiment of coated tools in the present disclosure.

In an embodiment illustrated in FIG. 1, a main surface of the coated tool in the present disclosure has an approximately quadrangular plate shape. However, there is no intention to limit to this shape. The coated tool 1 may include a first surface 2 (hereinafter referred to as a main surface 2), a second surface 3, and a cutting edge 4 located on at least a part of an intersection of the first surface 2 and the second surface 3. The first surface 2 is called as a rake surface, and the second surface 3 is called as a flank surface. It can also be said that the cutting edge 4 is located on at least the part of the intersection of the rake surface 2 and the flank surface 3.

Figure 2:
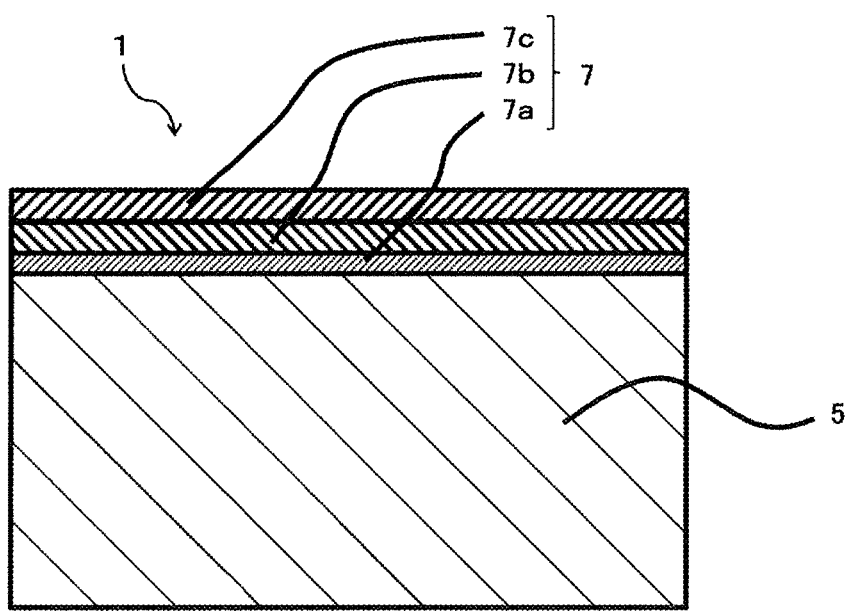
FIG. 2 is a schematic diagram for describing a configuration of a cross section of a coating layer in the coated tool in FIG. 1.

Referring to a schematic diagram of FIG. 2 illustrating a configuration of a cross section of a coating layer 7 in a coated tool 1, the coated tool 1 may include a base 5 and the coating layer 7 located on a surface of the base 5.

Examples of material constituting the base 5 of the coated tool 1 may include hard alloys, ceramics and metals. Examples of the hard alloys may include cemented carbides containing tungsten carbide (WC), and iron group metal such as cobalt (Co) or nickel (Ni). Other hard alloys may be Ti-based cermet containing titanium carbonitride (TiCN), and iron group metal such as cobalt (Co) or nickel (Ni). The ceramics may be $Si_3N_4$, $Al_2O_3$, diamond, or cubic boron nitride (cBN). The metals may be carbon steel, high-speed steel or alloy steel. Of these materials, cemented carbide or cermet is preferably used for the base 5 if used as the coated tool 1 in terms of fracture resistance and wear resistance.

As illustrated in FIG. 2, the coating layer 7 includes a first layer 7a having a thickness of 1 μm or more located near the base 5, and a second layer 7b located more away from the base than the first layer 7a. As used herein, the term "located near the base 5" denotes being located closer to the base 5 than the second layer 7b. The first layer 7a may be in contact with the base 5.

An erosion rate A2 of the second layer 7b is 0.4 μm or less, and an erosion rate A1 of the first layer 7a is 1.8 μm or less in the coated tool 1 of the present disclosure.

As used herein, the term "erosion rate" denotes a value obtained by evaluating a depth of an inspection object removed by collision of a liquid A in which 3 mass % of spherical $Al_2O_3$ particles having a mean particle diameter of 1.1-1.3 μm is dispersed in 100 mass % of pure water. Consequently, a low erosion rate ensures enhanced wear resistance of the inspection object. In other words, the inspection object having the low erosion rate is less prone to wear. The erosion rate may be measured by collision of the liquid A against a surface of the object at approximately right angles and at a speed of 98-102 m/s.

An MSE tester "MSE-Al2O3" manufactured by Palmeso Co., Ltd. may be used to measure the erosion rate.

The first layer 7a may be, for example, a TiN layer including TiN particles, a TiC layer including TiC particles, a TiCN layer including TiCN particles, or a TiCNO layer including TiCNO particles. The second layer 7b may be, for example, an $Al_2O_3$ layer including $Al_2O_3$ particles, or a $ZrO_2$ layer including $ZrO_2$ particles.

The TiN layer, the TiC layer, the TiCN layer and the TiCNO layer denote ones whose main components are respectively TiN, TiC, TiCN and TiCNO. As used herein, the term "main components" denotes ones whose contents are 50 mass % or more among crystals included in the individual layers. The contents may be obtained by Rietveld analysis using X-ray diffraction.

The erosion rate A1 of the first layer may be 1.5 μm/g or less in the coated tool 1 of the present disclosure. The erosion rate A2 of the second layer may be 0.35 μm/g or less in the coated tool 1 of the present disclosure. The coated tool 1 including the above configuration is more excellent in wear resistance and fracture resistance.

Alternatively, as illustrated in FIG. 2, the coated tool 1 of the present disclosure may further include a third layer 7c that is an uppermost layer located at a position more away from the base 5 than the second layer 7b. The third layer 7c may have a thickness of 0.1 μm or more. An erosion rate A3 of the third layer 7c which is measured by collision of the liquid A may be 0.0-2.0 μ/mg. The coated tool 1 including the above configuration is more excellent in wear resistance and fracture resistance.

The third layer 7c may be a TiN layer including TiN particles, a TiC layer including TiC particles, or a TiCN layer including TiCN particles. A smooth chip discharge is attainable because the third layer 7c contributes to excellent wear resistance and fracture resistance and reduced friction.

The base 5 may be a so-called cemented carbide composed mainly of WC. The base 5 composed mainly of cBN or diamond may also be used.

Alternatively, an underlayer (not illustrated) composed of TiN may be disposed between the base 5 and the first layer 7a. If the base 5 includes a component, such as Co, C (carbon) and W (tungsten), the underlayer serves to prevent these components from diffusing into a layer located on the underlayer. The underlayer may have a thickness of 0.1-1.0 μm.

Still alternatively, a TiCNO layer (not illustrated) as an intermediate layer may be disposed between the first layer 7a and the second layer 7b. The intermediate layer may be one which includes intermediate layers. A thickness of each of the intermediate layers may be less than 1 μm.

Structures and thicknesses in the individual layers, and shapes of crystals constituting each of the layers are measurable by observing an electron micrograph (Scanning Electron Microscopy (SEM) photograph or Transmission Electron Microscopy (TEM) photograph).

The coated tool 1 is intended to carry out a cutting process by bringing a cutting edge formed on the intersection of the rake surface and the flank surface into contact with a workpiece, thereby offering the excellent effect. The coated tool 1 of the present disclosure is applicable to, besides the cutting tools, various kinds of uses, for example, wear resistant components such as sliding components and metal dies, digging tools, tools such as blades, and impact resistant components. Also in these cases, the coated tool 1 may offer excellent mechanical reliability.

An embodiment of a method for manufacturing the tool in the present disclosure is described below.

Firstly, a mixed powder is prepared by suitably adding metal powder, carbon powder or the like to an inorganic powder, such as carbide, nitride, carbonitride and oxide, which are capable of forming a hard alloy that becomes a base by sintering, and then by mixing them together. Subsequently, with a known molding method, such as press molding, casting molding, extrusion molding or cold isostatic pressing, the mixed powder is molded into a predetermined tool shape. The base is manufactured by sintering an obtained molded body in a vacuum or a non-oxidizing atmosphere. Thereafter, a surface of the base may be subjected to polishing process, and a cutting edge part may be subjected to honing process as needed.

Subsequently, a coating layer is deposited on the surface by chemical vapor deposition (CVD) method.

The first step is to deposit a TiN layer that is the underlayer by setting the base in a chamber. Deposition is carried out at a deposition temperature of 830° C. and a gas pressure of 8 kPa by using a reaction gas whose composition is 0.1-20 vol % of titanium tetrachloride ($TiCl_4$) gas, 20 vol % of nitrogen ($N_2$) gas, and the rest, namely, hydrogen ($H_2$) gas.

The next step is to deposit a first layer that is a TiCN layer. Deposition is carried out at a deposition temperature of 830° C. and a gas pressure of 9 kPa by using a reaction gas whose composition is 5.0-20 vol % of titanium tetrachloride ($TiCl_4$) gas, 10-90 vol % of nitrogen ($N_2$) gas, 0.01-3.0 vol % of acetonitrile ($CH_3CN$) gas, and the rest, namely, hydrogen ($H_2$) gas. By increasing a content ratio of acetonitrile ($CH_3CN$) gas at a late stage than an early stage during the deposition, an average crystal width of titanium carbonitride columnar crystals constituting the first TiCN layer can be made larger on a side of the surface than on a side of the base. The first layer has a thickness of 1 μm or more. The first layer may have a thickness of 3-20 μm.

The next step is to deposit a first intermediate layer that is a TiCN layer. Deposition is carried out at a deposition temperature of 950° C. and a gas pressure of 9 kPa by using a reaction gas whose composition is 10-20 vol % of titanium tetrachloride ($TiCl_4$) gas, 0.5-10 vol % of methane ($CH_4$) gas, 10-70 vol % of nitrogen ($N_2$) gas, and the rest, namely, hydrogen ($H_2$) gas. The first intermediate layer has a thickness of less than 1 μm.

The next step is to deposit a second intermediate layer that is a TiCNO layer. Deposition is carried out at a deposition temperature of 950° C. and a gas pressure of 9 kPa by using a reaction gas whose composition is 10-20 vol % of titanium tetrachloride ($TiCl_4$) gas, 0.5-10 vol % of methane ($CH_4$) gas, 10-20 vol % of nitrogen ($N_2$) gas, 0.1-3.0 vol % of carbon monoxide (CO) gas, and the rest, namely, hydrogen ($H_2$) gas. The second intermediate layer has a thickness of less than 1 μm. A sum of the first intermediate layer and the second intermediate layer is less than 1 μm.

Deposition of a second layer that is an $Al_2O_3$ layer is carried out at a deposition temperature of 950-1100° C. and a gas pressure of 5-20 kPa by using a reaction gas whose composition is 5-20 vol % of aluminum trichloride ($AlCl_3$) gas, 0.006-2 vol % of hydrogen chloride (HCL) gas, 0.01-5 vol % of carbon dioxide ($CO_2$) gas, 0.001-0.01 vol % of hydrogen sulfide ($H_2S$) gas, and the rest, namely, hydrogen ($H_2$) gas. The second layer may have a thickness of 1-15 μm.

Subsequently, deposition of a TiN layer that is an uppermost layer and a third layer is carried out at a deposition temperature of 1010° C. and a gas pressure of 10 kPa by using a reaction gas whose composition is 0.06-5 vol % of titanium tetrachloride ($TiCl_4$) gas, 10-30 vol % of nitrogen ($N_2$) gas, and the rest, namely, hydrogen ($H_2$) gas. The third layer may have a thickness of 0.1-2 μm.

Although the embodiment including the first intermediate layer, the second intermediate layer and the third layer has been discussed above, the first layer that is the TiCN layer, and the second layer that is the $Al_2O_3$ layer may be laminated directly on the surface of the base.

While the coated tools 1 of the present disclosure have been described, the present disclosure is not limited to the above embodiments, and various improvements and changes may be made without departing from the spirit and scope of the present disclosure.

<Cutting Tools>

A cutting tool of the present disclosure is described below with reference to the drawings.

Figure 3:
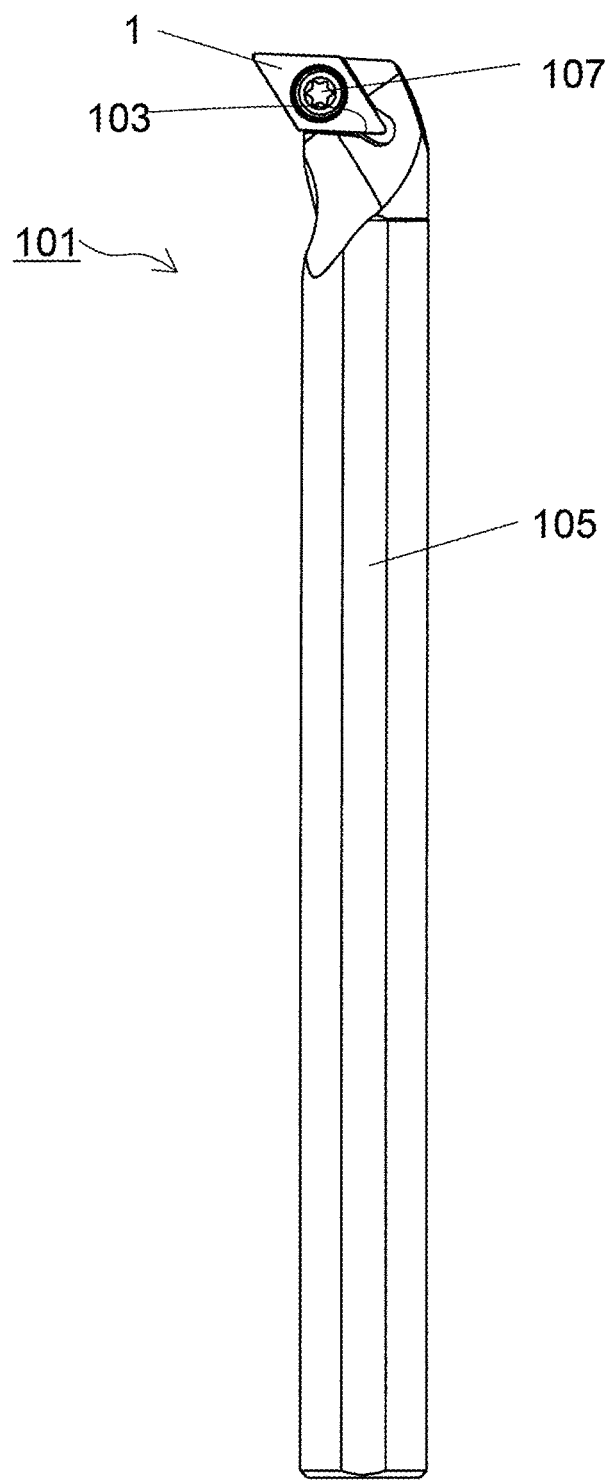
FIG. 3 is a plan view illustrating an embodiment of cutting tools in the present disclosure.

As illustrated in FIG. 3, the cutting tool 101 of the present disclosure is, for example, a bar-shaped body extended from a first end (an upper end in FIG. 3) toward a second end (a lower end in FIG. 3). As illustrated in FIG. 3, the cutting tool 101 includes a holder 105 with a pocket 103 located on a side of the first end (a tip), and the coated tool 1 located in the pocket 103. The cutting tool 101 includes the coated tool 1 and is therefore capable of carrying out a stable cutting process for a long period of time.

The pocket 103 is a part that permits attachment of the coated tool 1. The pocket 103 includes a seating surface parallel to a lower surface of the holder 105, and a constraining side surface inclined relative to the seating surface. The pocket 103 opens into a side of the first end of the holder 105.

The coated tool 1 is located in the pocket 103. A lower surface of the coated tool 1 may be in a direct contact with the pocket 103. Alternatively, a sheet (not illustrated) may be held between the coated tool 1 and the pocket 103.

The coated tool 1 is attached so that at least a part of a ridgeline where the first surface 3 intersects with the second surface 5, which is usable as the cutting edge 7, is protruded outward from the holder 105. The coated tool 1 is attached to the holder 105 by a screw 107 in the present embodiment. Specifically, the coated tool 1 is attached to the holder 105 in such a manner that screw parts are engaged with each other by inserting the screw 107 into the through hole 17 of the coated tool 1, and by inserting a front end of the screw 107 into a screw hole (not illustrated) formed in the pocket 103.

For example, steel and cast iron are usable as a material of the holder 105. Of these materials, highly rigid steel may be used.

The present embodiment has illustrated and described the cutting tool 101 for use in the so-called turning process. Examples of the turning process include inner diameter processing, outer diameter processing and grooving process. The cutting tool 101 is not limited to one which is used for the turning process. For example, the coated tools 1 of the above embodiments may be used for cutting tools used in a cutting process by rolling.

EXAMPLES

Firstly, 6 mass % of metal cobalt powder having a mean particle diameter of 1.2 μm, 0.5 mass % of titanium carbide powder having a mean particle diameter of 2.0 μm, 5 mass % of niobium carbide powder having a mean particle diameter of 2.0 μm, and the rest, namely, tungsten carbide powder having a mean particle diameter of 1.5 μm were added and mixed together in their respective proportions. A mixture thus obtained was molded into a tool shape (CNMG120408) by press molding, followed by debinding and sintering in a vacuum at 1500° C. and 0.01 Pa for one hour, thereby manufacturing a base composed of cemented carbide. Thereafter, the manufactured base was subjected to brushing and a part of the base, serving as a cutting edge, was subjected to round honing.

A coating layer was deposited on the base of the cemented carbide by chemical vapor deposition (CVD) method by combining individual deposition conditions presented in Table 1 as presented in Tables 2 and 3, thereby manufacturing a coated tool. The first intermediate layer being the TiCN layer, and the second intermediate layer being the TiCNO layer were sequentially deposited between the first layer and the second layer. The first intermediate layer had a thickness of 0.5 μm, and the second intermediate layer had a thickness of 0.1 μm.

In Table 1, T1 to T5 are deposition conditions of the TiCN layer that is the first layer, A1 to A5 are deposition conditions of the Al$_2$O$_3$ layer that is the second layer, and S1 to S3 are deposition conditions of the TiN layer that is the third layer.

In Table 1, individual raw material gases are expressed by chemical symbol, and occupation ratios of the individual raw material gases are indicated by vol %. All first layers have a thickness of 5 μm. All second layers have a thickness of 5 μm. All third layers have a thickness of 0.5 μm.

All first layers presented in Table 2 are TiCN layers. All second layers presented in Table 2 are Al$_2$O$_3$ layers. All third layers presented in Table 3 are TiN layers.

A first intermediate layer not presented in the tables was deposited at a deposition temperature of 950° C. and a gas pressure of 9 kPa by using a reaction gas whose composition was 15 vol % of titanium tetrachloride (TiCl$_4$) gas, 5 vol % of methane (CH$_4$) gas, 20 vol % of nitrogen (N$_2$) gas, and the rest, namely, hydrogen (H$_2$) gas.

A second intermediate layer 9 not presented in the tables was deposited at a deposition temperature of 950° C. and a gas pressure of 9 kPa by using a reaction gas whose composition is 15 vol % of titanium tetrachloride (TiCl$_4$) gas, 5 vol % of methane (CH$_4$) gas, 15 vol % of nitrogen (N$_2$) gas, 1.0 vol % of carbon monoxide (CO) gas, and the rest, namely, hydrogen (H$_2$) gas.

A SEM observation of a cross section including the coating layer in the above samples was carried out to measure a thickness of the individual layers. An erosion rate (μm/g) of each of the layers was measured by collision of a liquid A in a direction at right angles to the coating layer at a speed of 100 m/s.

Subsequently, wear life of the obtained coated tools was evaluated by carrying out a wear cutting test and an intermittent cutting test under the following conditions. Test results are presented on Tables 2 and 3.

<Wear Cutting Conditions>
  Workpiece: chromium molybdenum steel, round rod (SCM435)
  Tool Shape: CNMG120408
  Cutting Speed: 300 m/min
  Feed: 0.3 mm/rev
  Depth of Cut: 1.5 mm
  Others: Using water-soluble cutting fluid
  Evaluation Item: Time elapsed until a base material is exposed on the rake surface due to crater wear development <Intermittent Cutting Conditions>
  Workpiece: chromium molybdenum steel, round rod with four grooves (SCM440)
  Tool Shape: CNMG120408
  Cutting Speed: 300 m/min
  Feed: 0.3 mm/rev
  Depth of Cut: 1.5 mm
  Others: Using water-soluble cutting fluid
  Evaluation Item: The number of impacts exerted on a cutting edge until cutting edge fracture occurs

TABLE 1

| Type of layer | TiCl$_4$ | CH$_3$CN | CH$_4$ | H$_2$ | N$_2$ | AlCl$_3$ | HCl | CO$_2$ | H$_2$S | Ar | Temperature (° C.) | Pressure (kPa) |
|---|---|---|---|---|---|---|---|---|---|---|---|---|
| T1 | 14.71 | 1.26 | — | 63.03 | 21.01 | — | — | — | — | — | 870 | 9 |
| T2 | 16.55 | 0.71 | — | 70.92 | 11.82 | — | — | — | — | — | 850 | 9 |
| T3 | 18.87 | 0.27 | — | — | 80.86 | — | — | — | — | — | 825 | 9 |
| T4 | 14.29 | — | 4.08 | 51.22 | 20.41 | — | — | — | — | — | 1000 | 9 |
| T5 | 14.58 | — | 2.08 | 62.50 | 20.83 | — | — | — | — | — | 950 | 9 |
| A1 | — | — | — | 41.32 | — | 13.77 | 0.55 | 2.75 | 0.28 | 41.32 | 950 | 8 |
| A2 | — | — | — | 84.27 | — | 11.24 | 1.40 | 2.81 | 0.28 | — | 950 | 8 |
| A3 | — | — | — | 83.10 | — | 8.31 | 2.77 | 5.54 | 0.28 | — | 950 | 9 |
| A4 | — | — | — | 78.74 | — | 7.87 | 5.25 | 7.87 | 0.26 | — | 1000 | 9 |
| A5 | — | — | — | 80.86 | — | 10.78 | 2.70 | 5.39 | 0.27 | — | 1010 | 9 |
| S1 | 6.25 | — | — | 72.92 | 20.83 | — | — | — | — | — | 1010 | 10 |
| S2 | 6.12 | — | 2.04 | 71.43 | 20.41 | — | — | — | — | — | 1010 | 15 |
| S3 | 8.82 | — | 2.94 | 88.24 | — | — | — | — | — | — | 1010 | 10 |

TABLE 2

| Sample No. | First layer | Second layer | Erosion ratio A1 of first layer | Erosion ratio A2 of second layer | Wear test life time (min) | Fracture test (Times) |
|---|---|---|---|---|---|---|
| 1 | T1 | A1 | 1.01 | 0.22 | 42 | 15000 |
| 2 | T1 | A2 | 0.92 | 0.39 | 37 | 13000 |
| 3 | T1 | A3 | 0.95 | 0.49 | 22 | 12000 |
| 4 | T1 | A4 | 1.05 | 1.11 | 17 | 11000 |
| 5 | T1 | A5 | 1.01 | 2.21 | 10 | 12000 |
| 6 | T2 | A1 | 1.72 | 0.28 | 39 | 12000 |
| 7 | T2 | A2 | 1.79 | 0.39 | 35 | 12000 |
| 8 | T2 | A3 | 1.77 | 0.52 | 19 | 10000 |
| 9 | T2 | A4 | 1.69 | 1.02 | 17 | 9000 |
| 10 | T2 | A5 | 1.75 | 2.21 | 8 | 11000 |
| 11 | T3 | A1 | 4.32 | 0.19 | 28 | 7000 |
| 12 | T3 | A2 | 4.13 | 0.37 | 24 | 8000 |
| 13 | T3 | A3 | 4.22 | 0.55 | 18 | 7000 |
| 14 | T3 | A4 | 4.21 | 1.21 | 15 | 8000 |
| 15 | T3 | A5 | 4.14 | 2.03 | 11 | 7000 |
| 16 | T4 | A1 | 3.21 | 0.29 | 39 | 7000 |
| 17 | T4 | A2 | 3.38 | 0.38 | 32 | 7000 |
| 18 | T4 | A3 | 3.28 | 0.61 | 20 | 3000 |
| 19 | T4 | A4 | 3.33 | 1.31 | 15 | 3000 |
| 20 | T4 | A5 | 3.41 | 2.02 | 12 | 4000 |
| 21 | T5 | A1 | 5.12 | 0.29 | 38 | 5000 |
| 22 | T5 | A2 | 5.13 | 0.39 | 32 | 4000 |
| 23 | T5 | A3 | 5.07 | 0.55 | 20 | 1000 |
| 24 | T5 | A4 | 5.01 | 1.17 | 16 | 1000 |
| 25 | T5 | A5 | 5.01 | 2.01 | 11 | 1000 |

TABLE 3

| Sample No. | First layer | Second layer | Third layer | Erosion ratio A3 of third layer | Wear test life time (min) | Fracture test (Times) |
|---|---|---|---|---|---|---|
| 26 | T1 | A1 | S1 | 1.1 | 50 | 18,000 |
| 27 | T1 | A1 | S2 | 3.9 | 39 | 12,000 |
| 28 | T1 | A1 | S3 | 1.8 | 47 | 16000 |

As presented in Table 2, Samples Nos. 1, 2, 6 and 7, each including the first layer whose erosion rate A2 is 0.4 μm/g or less and whose erosion rate A1 is 1.8 μm/g or less, have excellent wear resistance.

As presented in Table 3, Samples Nos. 26 and 28, each further including the third layer whose erosion rate A3 is 2.0 μm/g or less, have more excellent wear resistance.

The invention claimed is:

1. A coated tool, comprising:
   a base; and
   a coating layer located on the base,
   wherein
   the coating layer comprises a first layer having a thickness of 1 μm or more located near the base, and a second layer located more away from the base than the first layer,
   an erosion rate A2 in the second layer is 0.4 μm/g or less which is obtained from a measurement by collision of a liquid A, in which 3 mass % of spherical Al$_2$O$_3$ particles having a mean particle diameter of 1.1-1.3 μm is dispersed in pure water, against the second layer at approximately right angles and at a speed of 98-102 m/s,
   an erosion rate A1 in the first layer is 1.8 μm/g or less which is obtained from a measurement by collision of the liquid A against the first layer at approximately right angles and at a speed of 98-102 m/s,
   the erosion rate A1 is 1.5 μm/g or less, and
   the erosion rate A2 is 0.35 μm/g or less.

2. The coated tool according to claim 1, wherein the first layer is any one of a TiN layer, a TiC layer or a TiCN layer.

3. The coated tool according to claim 1, wherein the second layer is either an Al$_2$O$_3$ layer or a ZrO$_2$ layer.

4. The coated tool according to claim 1, wherein
   the coating layer further comprises a third layer as an uppermost layer, and
   an erosion rate A3 in the third layer is 0.0-2.0 μm/g which is obtained from a measurement by collision of the liquid A against the third layer at approximately right angles and at a speed of 98-102 m/s.

5. The coated tool according to claim 4, wherein the third layer is any one of a TiN layer, a TiC layer or a TiCN layer.

6. The coated tool according to claim 1, wherein the base is a WC-based cemented carbide.

* * * * *